United States Patent
Gutnik et al.

(10) Patent No.: US 7,453,388 B1
(45) Date of Patent: Nov. 18, 2008

(54) SLICE VOLTAGE COMPENSATION

(75) Inventors: Vadim Gutnik, Austin, TX (US); Jerrell P. Hein, Driftwood, TX (US)

(73) Assignee: Silicon Laboratories Inc., Austin, TX (US)

( * ) Notice: Subject to any disclaimer, the term of this patent is extended or adjusted under 35 U.S.C. 154(b) by 1055 days.

(21) Appl. No.: 10/303,398

(22) Filed: Nov. 25, 2002

Related U.S. Application Data (60) Provisional application No. 60/396,499, filed on Jul. 17, 2002.

(51) Int. Cl.
*H03M 1/12* (2006.01)

(52) U.S. Cl. .................................. 341/155; 375/317

(58) Field of Classification Search ............ 341/155, 341/154; 348/540, 541, 546, 531; 375/317, 375/351; 369/59.18; 324/678
See application file for complete search history.

(56) References Cited

U.S. PATENT DOCUMENTS

| | | | | |
|---|---|---|---|---|
| 5,331,411 A | * | 7/1994 | Kawakami et al. | 348/708 |
| 5,436,934 A | * | 7/1995 | Co | 375/351 |
| 5,469,068 A | * | 11/1995 | Katsuma | 324/678 |
| 5,966,356 A | * | 10/1999 | Kawashima et al. | 369/47.35 |
| 6,002,538 A | * | 12/1999 | Kanegae et al. | 360/46 |
| 6,028,642 A | * | 2/2000 | Rinaldi et al. | 348/540 |
| 6,041,084 A | * | 3/2000 | Nagaraj | 375/317 |
| 6,385,391 B1 | * | 5/2002 | Higuchi | 386/100 |
| 6,611,485 B2 | * | 8/2003 | Kim et al. | 369/59.18 |
| 6,657,488 B1 | * | 12/2003 | King et al. | 330/9 |
| 6,686,861 B1 | * | 2/2004 | Kobayashi et al. | 341/155 |

* cited by examiner

*Primary Examiner*—Rexford Barnie
*Assistant Examiner*—Joseph Lauture
(74) *Attorney, Agent, or Firm*—Zagorin O'Brien Graham LLP

(57) ABSTRACT

An integrated circuit includes an internal resistance ($R_{INT}$) and a compensation circuit coupled to adjust a slice level specified by a slice signal to a compensated slice level according to a difference between the internal resistance ($R_{INT}$) and a known resistance ($R_{EXT}$). A reference voltage is coupled to the internal resistance to generate an internal current and is coupled to the known resistance to generate a known current. The compensated slice level is determined according to the internal current and the known current. The compensated slice level may be generated using an analog to digital converter coupled to a digital to analog converter that scale original slice signal based on the internal and known currents.

25 Claims, 8 Drawing Sheets

SLICE VOLTAGE COMPENSATION

CROSS-REFERENCE TO RELATED APPLICATION

This application claims the benefit of provisional Application No. 60/396,499, filed Jul. 17, 2002, which application is incorporated herein by reference in its entirety.

BACKGROUND

1. Field of the Invention

This application relates to receivers for high speed data and more particularly to slice levels used in such receivers to set a threshold at which an incoming signal is determined to be a one or zero.

2. Description of the Related Art

Figure 1:
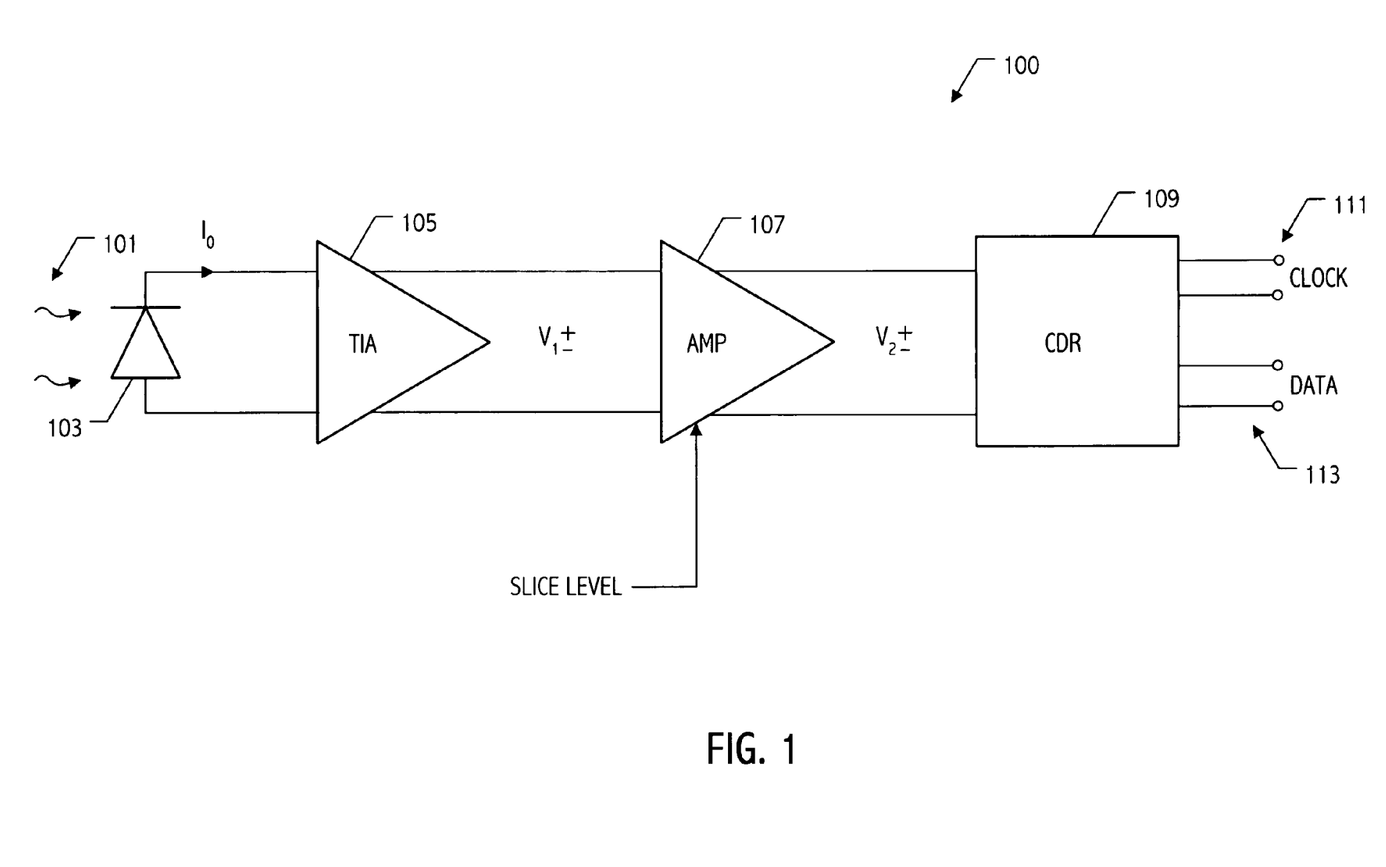
FIG. 1 shows the block diagram of a typical high-speed optical receiver system.

FIG. 1 shows the block diagram of a typical high-speed optical receiver system 100. The received optical energy 101 is converted to a current using a photodiode, 103. The photodiode signal current $I_0$ is converted to a voltage using the transimpedance amplifier (TIA) 105. The signal at the output of TIA 105 is small for low optical energy signals, and can contain significant corruption due to, e.g., noise and limited rise and fall times. The output of TIA 105 is followed by additional gain, usually implemented with a limiting amplifier or an automatic gain control (AGC) amplifier 107. The clock and data recovery circuit 109 recovers both the data and the clock typically embedded in the input data stream received by the photodiode D1 and provides differential clock and data signals 111 and 113, respectively.

The function of the limiting amplifier is to produce a consistent waveform from the TIA output, which can be used by a clock and data recovery circuit (CDR) 109, irrespective of the incoming optical energy. The clock and data recovery circuit 109 recovers both the data and the clock typically embedded in the input data stream received by the photodiode 103 and provides differential clock and data signals 111 and 113.

Figure 2A:
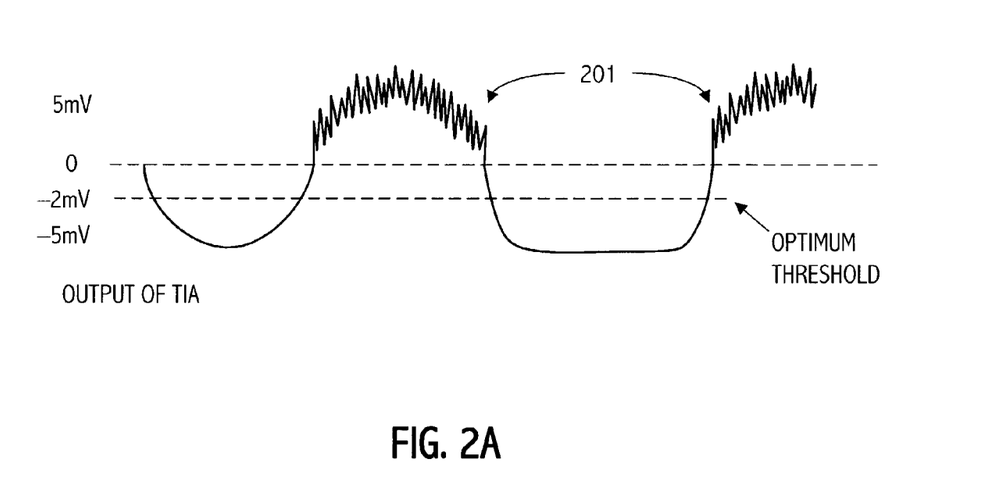
FIG. 2A shows the output from the TIA amplifier shown in FIG. 1.
Figure 2B:
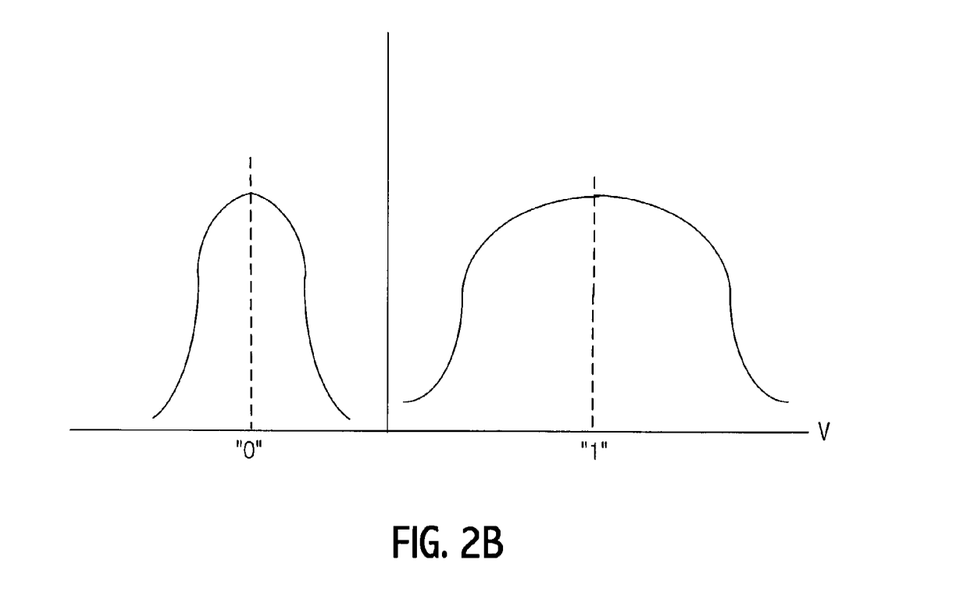
FIG. 2B illustrates the different distribution of 1's and 0's.

The TIA output voltage is shown in FIG. 2A. At low levels of optical energy (corresponding to a zero level bit for example), the noise current is low. At higher levels of optical energy (corresponding to a one-level bit), the noise current may be higher. This asymmetry, as shown in FIG. 2A, may require an introduction of an intentional offset, to create a more reliable output. FIG. 2B illustrates this asymmetry by showing that the distribution of 0's is much tighter than the distribution of 1's. The intentional offset utilized to account for this asymmetry is referred to as a slice level.

A slice level can be thought of as the threshold voltage at which an incoming signal is determined to be either a "1" bit or a "0" bit. An adjustable slice level can compensate for the asymmetric noise characteristic present in the photodiode and the TIA output or for some nonlinearly in the TIA and photodiode.

As shown in FIG. 2A, a slice level of zero gives a smaller amount of margin for the positive swing compared to the negative swing. If the threshold is set to roughly −2 mV in the case shown, the margin is more symmetric and better results are to be expected. Thus, introducing a small offset serves to optimize noise margin and signal strength. Amplifier stage 107 utilizes an adjustable slicing level to compensate for the asymmetric noise characteristic present in the photodiode output.

Figure 3:
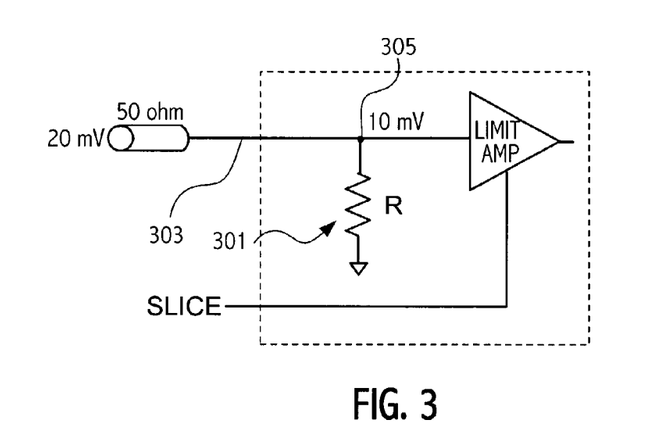
FIG. 3 illustrates the voltage divider effects in a receiver.

Referring now to FIG. 3, an internal terminating resistor 301 is typically used in high speed systems to terminate a high speed data path. Assuming the resistance of the signal line 303 is 50 ohms and a 20 mV signal was supplied to the signal line 303, if resistor 301 were an ideal 50 ohms, the voltage at node 305 would be 10 mV. However, the on chip resistor 301 is not ideal and in fact varies by, e.g., 15%, due to such factors as process and temperature variations. Thus, although a slice voltage level is specified to account for noise margin and signal strength, the slice voltage does not account for the variation in signal level due to the non-ideal nature of the terminating resistor 301. That error is approximately $\Delta R/2$, where $\Delta R$ represents the difference from the nominal value of R.

It would be desirable to adjust the slice voltage to account for the variation in resistance of the terminating resistance.

SUMMARY

Accordingly, the invention provides in one embodiment an integrated circuit that includes an internal resistance ($R_{INT}$) and a compensation circuit coupled to adjust a slice level specified by a slice signal to a compensated slice level according to a difference between the internal resistance ($R_{INT}$) and a known resistance ($R_{EXT}$). In an embodiment of the invention a known first reference voltage is coupled to the internal resistance to generate an internal current and a known second reference voltage, which may be the same as the first reference voltage, is coupled to the known resistance to generate a known current. The compensated slice level is determined according to the internal current and the known current.

In an embodiment, the integrated circuit includes an analog to digital converter circuit coupled to convert a signal representing the slice level to a scaled digital signal representing the slice level scaled according to a first scaling factor and further includes a digital to analog converter circuit coupled to receive the scaled digital signal and coupled to supply an analog signal scaled by a second scaling factor. In an embodiment, the first scaling factor is proportional to $((1/R_{INT})+(1/R_{EXT}))$ and the second scaling factor is proportional to $1/R_{EXT}$.

The percentage difference between an actual value of the internal resistance $R_{INT}$ and its nominal value tracks the percentage difference between an actual value of a termination resistor coupled to an input terminal of the integrated circuit and its nominal value.

In another embodiment the invention provides a method that includes compensating a slice level used to determine a 0 and 1 threshold level for an incoming signal, according to a difference of an internal resistance ($R_{INT}$) from a predetermined resistance (R). In an embodiment, the method further includes generating a digital slice value of a slice level, scaling the digital slice level valve to generate a digital compensated slice level, and converting the digital compensated slice level to an analog signal. In another embodiment, the method includes supplying a slice signal indicative of the slice level to an analog to digital converter (ADC) circuit, supplying an output of the ADC circuit to a digital to analog converter (DAC) circuit, and supplying the compensated slice signal from the DAC.

In another embodiment a method is provided for adjusting a slice voltage ($V_{SLICE}$) by a ratio $R_{INT}/(R_{INT}+R)$, where R is a predetermined resistance and $R_{INT}$ is an internal resistance, thereby adjusting slice voltage to compensate for a difference between an actual value of a termination resistance and a nominal value of the termination resistance.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 4:
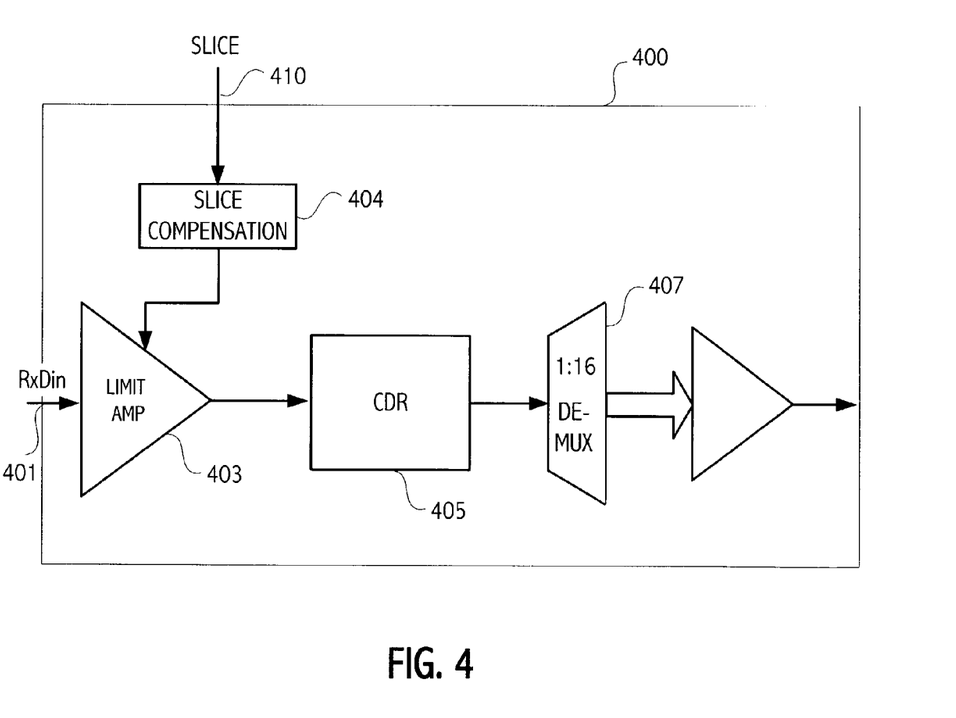
FIG. 4 a high level block diagram of an exemplary receiver with a slice compensation circuit.

Referring to FIG. 4, a high level block diagram of an exemplary receiver 400 is illustrated that is suitable for use in a high-speed serial communications system compliant with standards such as Synchronous Optical Network (SONET) or Synchronous Digital Hierarchy (SDH) (the European counterpart to SONET). High speed serial data is received on data in terminal 401 and supplied to limiting amplifier 403. An internal termination resistance (not shown) is utilized. The limiting amplifier 403 allows adjustment of the 0/1 decision threshold, or slice level, to allow for optimization of bit-error-rates (BER). That slice level is compensated in compensation block 404 based on the variation in the internal terminal resistance for high speed serial data from the nominal resistance. A clock and data recovery (CDR) circuit 405 is used to recover clock and data from the input signal on data in terminal 401. The recovered clock and data is then deserialized by a 1:16 demultiplexer 407. The slice level is specified by voltage supplied on input terminal 410.

Note that although FIG. 4 shows a single-ended system to simplify the figure, it is common for many of the illustrated signals in the figures herein, to be differential, and the principles described herein are still applicable.

In order to compensate for the variations in on-chip termination resistance from its nominal value, that variation has to be determined. In one embodiment, that termination resistance is formed by polysilicon. Rather than measure that resistance directly, the resistance of another on-chip resistance is measured that is also formed by polysilicon. The second resistance tracks percentage variations in the termination resistance from its nominal value sufficiently closely that determining the second resistance is a good surrogate for determining the termination resistance. One may enhance the degree with which the second resistance tracks variations in the value of the termination resistance by building the two resistors out of the same unit resistors.

Resistance is proportional to length, and inversely proportional to width of a resistor. So, two on-chip resistors (made of the same material) of the same L/W would have the same resistance. If 10 microns long and 1 micron wide is 4 kohm, 100 microns long and 10 microns wide is also 4 kohm. However, there might be slight variations in width and length of the resistors. So, if because of manufacturing process, the widths on chip shrink by 0.1 micron, there exists a 10/0.9 resistor, and a 100/9.9 resistor, and they'd no longer be the same value. A similar thing happens if the lengths change slightly. For this reason, if two resistors are to match, they should be made the same size. Sometimes, this is inconvenient; for example, the desired termination resistance is 50 ohms, but the internal and external resistors are preferably several kohm. Therefore, a unit resistor of 400 ohms is utilized, e.g., 5 microns long and 1 micron wide. Then, to make 50 ohms, eight 400 ohm unit resistors are put in parallel. In order to make a four kohms resistor, 10 400 ohm unit resistors are put in series. Since all the resistors are made of the same units, if each unit shrinks or grows by a fixed amount, all the resistors still have the correct ratios to each other.

Figure 5:
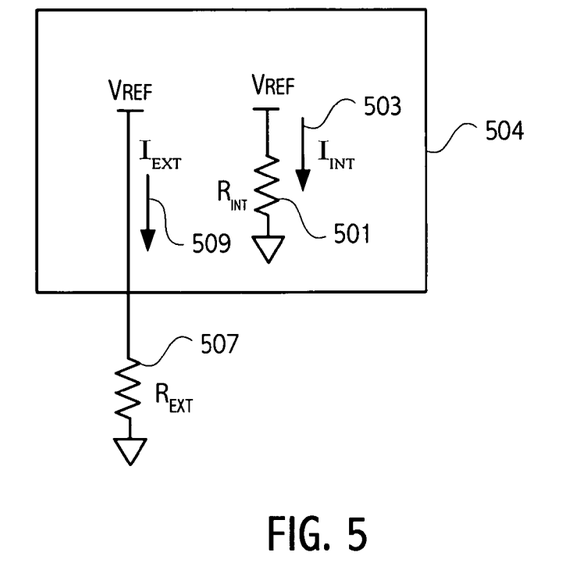
FIG. 5 illustrates a high level diagram of how currents are generated for use with the slice compensation circuit.

FIG. 5 illustrates conceptually one aspect of the approach to determining the value of the other on-chip resistor used as a surrogate for the termination resistance. A known voltage $V_{REF}$ is utilized to generate a current 503 ($I_{INT}$) through an on-chip resistor 501. Because the value of the on-chip resistor 501 varies by, e.g., 15%, the current 503 also varies according to the value of the resistor. In order to determine the unknown resistor 501, a second resistor 507 having a known value is utilized. The resistor 507 may be a precision resistor accurate to, e.g., 1%. A band-gap voltage on the integrated circuit may be utilized as the reference voltage $V_{REF}$ to provide an accurate voltage source. The resistor having a known value is, in the embodiment illustrated in FIG. 5, external to the integrated circuit 504, in which on-chip resistor 501 is formed. A known voltage, e.g., $V_{REF}$ generates a current 509 ($I_{EXT}$). Because both the resistance and voltage are known, the current 509 is also known. By determining the ratio of the known current $I_{EXT}$ to the unknown current $I_{INT}$, the variation in the on-chip resistor from the nominal value is known. That in turn allows the slice voltage to be adjusted since the on-chip termination resistor also varies from the nominal by the same percentage.

Figure 6:
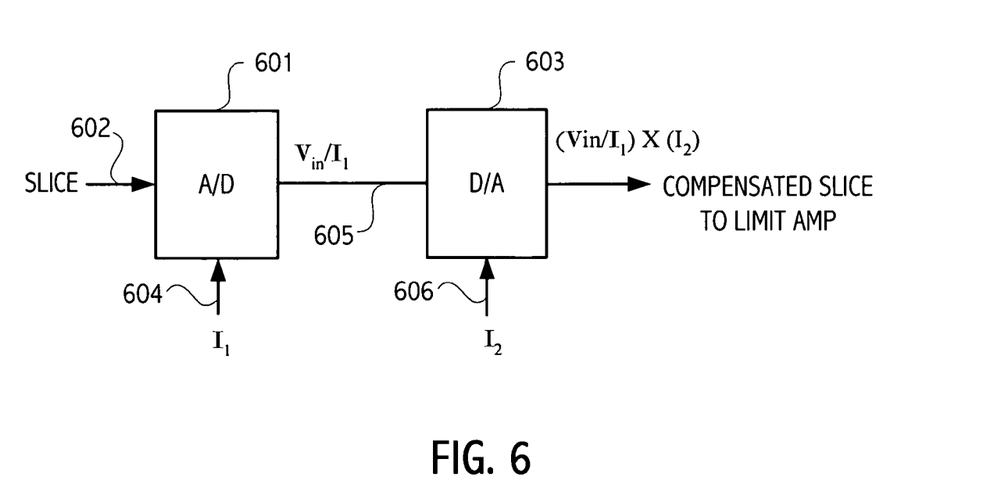
FIG. 6 illustrates a block diagram of a slice compensation circuit.

In one embodiment, the currents described above are used to compensate the slice voltage for the variation in on-chip termination resistance. Referring to FIG. 6, a block diagram illustrates how the slice voltage is supplied to an analog to digital converter 601 on node 602. In one embodiment, that analog to digital converter 601 is a sigma delta analog to digital (A/D) converter described in more detail below. A current 604 ($I_1$) is supplied to A/D converter 601 to scale the slice voltage supplied on node 602. The A/D converter provides an output $V_{SLICE}/I_1$. Note that a current representation of $V_{SLICE}/I_1$ may be used instead. The output on 605 is supplied to a digital to analog converter 603 which scales the signal received using current 606 $I_2$) to provide as its output a compensated slice signal having a value of ($V_{SLICE}/I_1$)×($I_2$). $I_1$ is proportional to ($1/R_{INT}+1/R_{EXT}$). $I_2$ is proportional to ($2/R_{EXT}$). As can be seen from FIG. 5, those currents (($V_{REF}/R_{INT}$) and ($V_{REF}/R_{EXT}$)) are readily available on chip. Thus, the output from the DAC 603 is $$V_{SLICE}\left(\frac{2/R_{EXT}}{1/R_{INT}+1/R_{EXT}}\right)$$

If $R_{INT}$ and $R_{EXT}$ are the same, the output of the DAC 603 is $V_{SLICE}$. Otherwise the output of the DAC scales the slice voltage by a close approximation of the voltage divider ratio of the external line resistance on line 303 and the internal termination resistance 301 (see FIG. 3) and multiplies that voltage divider ratio by two to obtain the full slice voltage.

Figure 7:
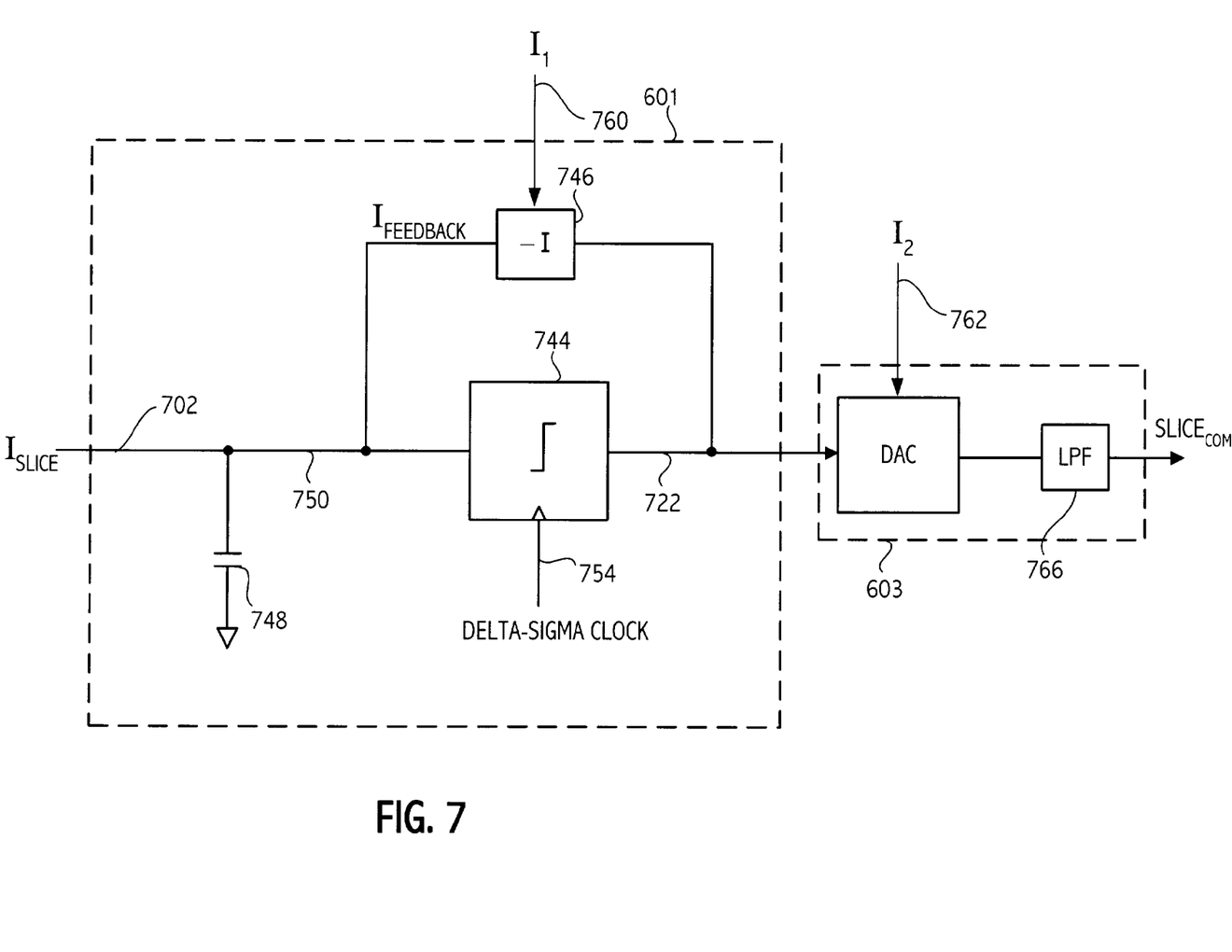
FIG. 7 illustrates a more detailed block diagram of a slice compensation circuit.

Referring now to FIG. 7, a block diagram of analog to digital converter 601 is shown. A slice current $I_{SLICE}$ is derived from the slice voltage and supplied to the A/D 601 on node 702. The delta-sigma modulator 601 then converts the slice signal to a one-bit digital stream output on its output node 722. The delta-sigma modulator 601 includes a modest-sized (e.g., having a typical value of 2-3 pF) integrating capacitor 748 connected to node 750, and further includes a digital comparator block 744 which samples the voltage on its input node 750 when clocked by a delta-sigma clock received on clock node 745. Such a comparator block 744 includes a gain stage followed by a register. The digital output generated on the output node 722 is fed back as a negative current by feedback block 746 into node 750 to provide the requisite feedback into the integrating capacitor 748 of the delta-sigma modulator. Operation of such first-order delta-sigma modulators is well-known to those skilled in the art. Note that the clock rate for the delta-sigma clock is not critical since the slice voltage input is virtually static.

The feedback block 746 is, as is well known in the art, a one bit sigma delta current DAC. The serial bit stream from ADC 601 is also supplied to another one bit sigma delta current DAC 603. The current based sigma delta digital to analog converters switch the given current to add to the output for a '1' and subtract from the output for an input '0'. Therefore, the output of each current DAC is just the input current times the duty cycle centered about 0 for a 50% duty cycle. Feedback block 746 and DAC 603 have the scale currents $I_1$ and $I_2$ supplied on nodes 760 and 762 respectively to scale the outputs of the ADC 601 and DAC 603 as described above. The DAC 603 includes low pass filter 766. The compensated slice signal is supplied by low pass filter 766.

In other embodiments, the scaling of the slice voltage may be done digitally. For example, digital values of the slice voltage, the internal current and the external current may be obtained. In fact, a single analog to digital converter may be coupled to a multiplexer that selects one of the signals to convert and stores the results in a register. Note that if such digital signals are generated, the analog to digital converter would also utilize a decimation stage to provide a digital number representing the value of the slice voltage, and the internal and external currents. Those results can then be used to scale the digital value of the slice voltage using digital logic. Various implementations of such digital circuits would be readily apparent to those of skill in the art given the scale factors provided above. Once the digital value of the slice voltage is determined, that digital value is then supplied to a digital to analog converter and supplied to the limiting amplifier as an analog signal.

Figure 8A:
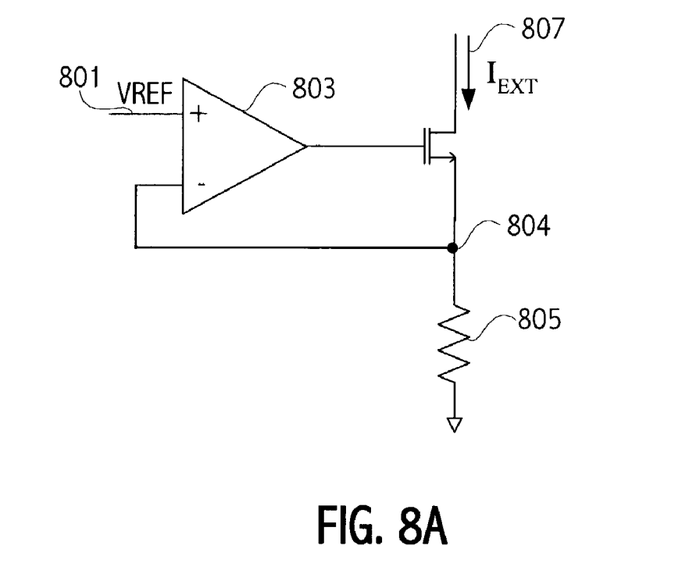
FIG. 8A illustrates an embodiment of a circuit for determining the current across the known external resistance.
Figure 8B:
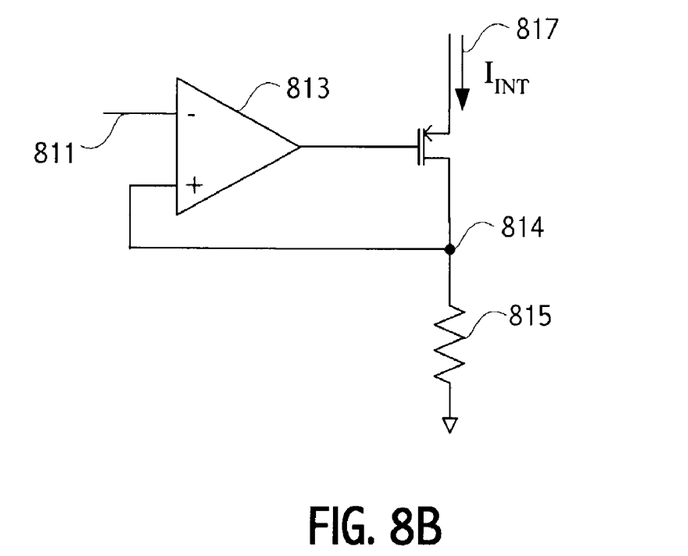
FIG. 8B illustrates an embodiment of a circuit for determining the current across the known external resistance.

FIGS. 8A and 8B illustrated embodiments for obtaining currents through the known precision external resistor and the unknown internal resistance. Referring to FIG. 8A, a known reference voltage is supplied on node 801. The operation of op-amp 803 causes the known reference voltage to appear at node 804 causing a current 807 to flow through resistance 805. Since the reference voltage is known and assuming the resistance is known, the current 807 is also known. Note that although the circuit shown in FIG. 8A illustrates obtaining the external current, the circuit also is applicable to measuring the current across the unknown internal resistance. Once the current 807 is generated, well known current mirroring techniques can be used to generate copies of that current.

Referring to FIG. 8B, a known reference voltage is supplied on node 811. The operation of op-amp 813 causes the known reference voltage to appear at node 814 causing a current 817 to flow through resistance 815. Since the reference voltage is known and assuming the resistance is the unknown internal resistance, the current 807 varies according to the resistance 815. Note that although the circuit shown in FIG. 8B illustrates obtaining the internal current, the circuit also is applicable to measuring the current across the known resistance. Once the current 817 is generated, well known current mirroring techniques can be used to generate copies of that current.

Figure 9:
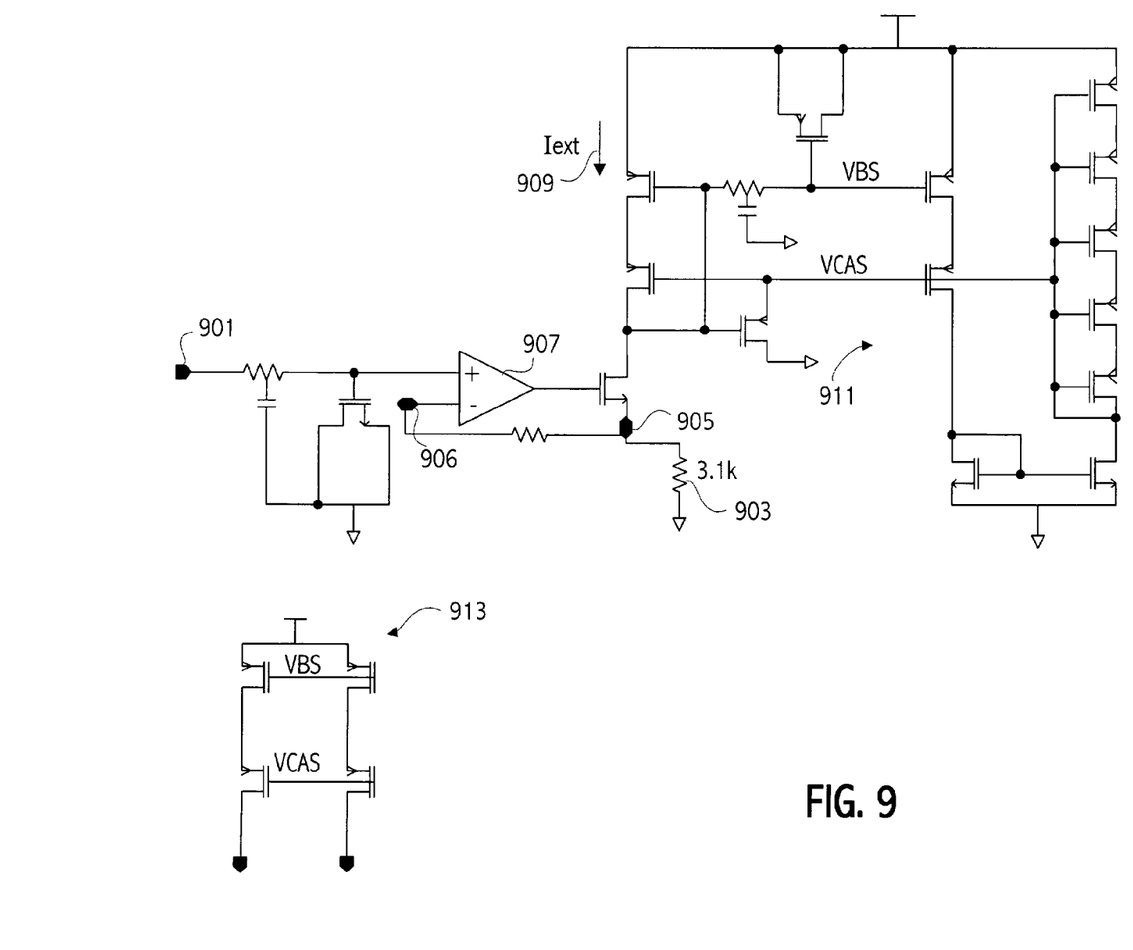
FIG. 9 illustrates in greater detail an embodiment of a circuit for determining the current across the known external resistance.

Referring now to FIG. 9, a more detailed circuit diagram is shown illustrating how the current through the external precision resistor is obtained in one embodiment of the invention. The current mirroring technique illustrated is known to those of skill in the art. A reference voltage is supplied on node 901. In one embodiment, that reference voltage is a voltage divided band-gap voltage. An external 3.1K precision resistor 903 is coupled on node 905. Node 906 couples to op-amp 907 to the precision resistor 903. The op-amp functions to set the voltage at node 905 to the reference voltage. Since the reference voltage is known and the resistor 903 is known the current 909 ($I_{EXT}$) is known. That current is copied in current mirror 911. Additional copies may be generated as shown in current mirrors 913.

Figure 10:
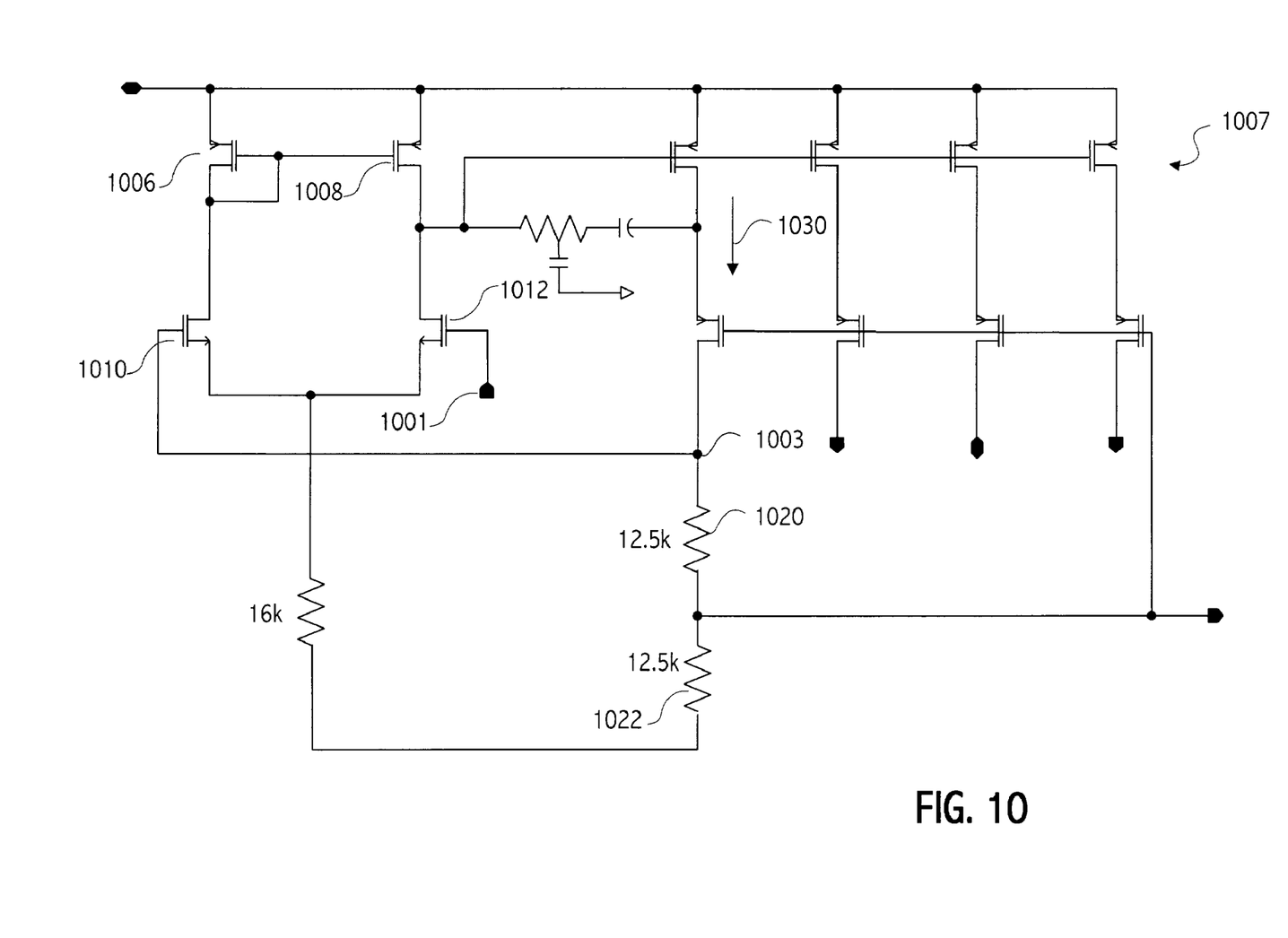
FIG. 10 illustrates in greater detail an embodiment of a circuit for determining the current across the internal resistance.

Referring to FIG. 10, a more detailed circuit diagram illustrates the how the current through an internal resistance is determined. As pointed out above, the variation in the polysilicon resistance from its nominal value, is reflected in the difference between the current through that internal resistance and the known current $I_{EXT}$ flowing through the precision external resistor. That difference can be used as the basis for compensating the slice voltage level. A band-gap reference voltage is supplied on node 1001. That voltage is forced on node 1003 by operation of the transistor pairs 1006, 1008, 1010, and 1012. Thus, a known voltage is caused to appear across the resistors 1020 and 1022. A current 1030 ($I_{INT}$) flows through node 1003. That current is copied by current mirrors 1007 which form multiple copies of the current at various current levels as indicated in FIG. 9. The variation in the values of the resistors 1020 and 1022 from their nominal value is reflected in the current 1030 ($I_{INT}$). That current can be combined with $I_{EXT}$ generated as described with reference to FIGS. 8A and 9 to provide the necessary information in order to scale the slice voltage to reflect the variation in the terminal resistance from its nominal 50 ohm value based on the variation in resistors 1020 and 1022 from their nominal value.

Thus, an approach for compensating slice voltage has been described. The description of the invention set forth herein is illustrative, and is not intended to limit the scope of the invention as set forth in the following claims. Other variations and modifications of the embodiments disclosed herein, may be made based on the description set forth herein, without departing from the scope and spirit of the invention as set forth in the following claims.

What is claimed is:

1. An integrated circuit comprising:
   an internal resistance ($R_{INT}$);
   a compensation circuit coupled to adjust a slice level specified by a slice signal to a compensated slice level according to a difference between the internal resistance ($R_{INT}$) and a known resistance ($R_{EXT}$).

2. The integrated circuit as recited in claim 1 further comprising a known first voltage reference coupled to the internal resistance to generate an internal current and a known second voltage reference coupled to the known resistance to generate a known current, and wherein the compensated slice level is determined according to the internal current and the known current.

3. The integrated circuit as recited in claim 1 wherein the compensation circuit includes an analog to digital converter circuit coupled to convert a signal representing the slice level to a scaled digital signal representing the slice level scaled according to a first scaling factor.

4. The integrated circuit as recited in claim 3 wherein the compensation circuit further comprises a digital to analog converter circuit coupled to receive the scaled digital signal and coupled to supply an analog signal scaled by a second scaling factor corresponding to the compensated slice signal.

5. The integrated circuit as recited in claim 4 wherein the scaled digital signal is supplied as a serial bit stream to the digital to analog converter.

6. The integrated circuit as recited in claim 4 wherein the first scaling factor is proportional to $((1/R_{INT})+(1/R_{EXT}))$.

7. The integrated circuit as recited in claim 6 wherein the digital to analog converter scales the signal received from the analog to digital converter by a second scaling factor, the second scaling factor being proportional to $1/R_{EXT}$.

8. The integrated circuit as recited in claim 1 wherein the known resistance is external to the integrated circuit.

9. The integrated circuit as recited in claim 1 wherein a percentage difference between an actual value of the internal resistance $R_{INT}$ from a nominal value of the internal resistance tracks a percentage difference between an actual value of a termination resistor coupled to an input terminal of the integrated circuit from a nominal value of the termination resistor.

10. The integrated circuit as recited in claim 1 wherein the compensation circuit generates a digital value of the compensated slice level.

11. The integrated circuit as recited in claim 10 wherein the compensation circuit further includes an analog to digital converter coupled to convert the slice level, an internal current corresponding to the internal resistance, and a known current to respective digital values.

12. A method comprising compensating a slice level used to determine a 0 and 1 threshold level for an incoming signal, according to a difference between an internal resistance ($R_{INT}$) and a predetermined resistance (R).

13. The method as recited in claim 12 further comprising:
   generating a digital slice value of a slice level;
   scaling the digital slice level value to compensate the slice level to generate a digital compensated slice level.

14. The method as recited in claim 13 further comprising converting the digital compensated slice level to an analog signal.

15. The method as recited in claim 12 further comprising:
   supplying a slice signal indicative of the slice level to an analog to digital converter (ADC) circuit;
   supplying an output of the ADC circuit to a digital to analog converter (DAC) circuit; and
   supplying the compensated slice signal from the DAC.

16. The method as recited in claim 15 further comprising:
   scaling the slice signal in the ADC circuit by a first scaling factor proportional to $((1/R_{INT})+(1/R))$ to supply a first scaled signal; and
   scaling the first scaled signal in the DAC by a second scaling factor proportional to $1/R$, thereby supplying a compensated slice voltage proportional to $(R_{INT}/(R+R_{INT}))$.

17. The method as recited in claim 16 wherein the compensated slice voltage is $2(R_{INT}/(R+R_{INT}))$.

18. The method as recited in claim 12 further comprising using a precision resistor to provide the predetermined resistance.

19. The method as recited in claim 12 further comprising:
   supplying a first current ($I_1$) to the ADC and supplying as the output of the ADC a signal $I_{SLICE}/I_1$, $I_1$ being proportional to $((1/R_{INT})+(1/R))$; and
   supplying a second current ($I_2$) to the DAC and supplying as the output of the DAC a signal $(I_{SLICE}/I_1) \times (I_2)$, $I_2$ being proportional to $(1/R)$, where $I_{SLICE}$ is a signal corresponding to the slice level.

20. A method comprising adjusting a slice voltage ($V_{SLICE}$) by a ratio $R_{INT}/(R_{INT}+R)$, where R is a predetermined resistance and $R_{INT}$ is an internal resistance, thereby adjusting the slice voltage to compensate for a difference between an actual value of a termination resistance and a nominal value of the termination resistance.

21. An integrated circuit comprising:
   an internal resistance;
   means for compensating a received slice level according to a variation of the internal resistance from a known resistance.

22. An apparatus comprising:
   a termination resistance; and
   means for adjusting a slice voltage to compensate for a difference between an actual value of the termination resistance and a nominal value of the termination resistance.

23. A method comprising adjusting a slice voltage ($V_{SLICE}$) by a radio proportional to $R_{INT}/(R_{INT}+R)$, where R is a predetermined resistance and $R_{INT}$ is an internal resistance, thereby adjusting the slice voltage to compensate for a difference between an actual value of a termination resistance and a nominal value of the termination resistance.

24. An integrated circuit comprising:
   a termination resistance coupled to an input terminal for receiving an input signal;
   a compensation circuit configured to generate a slice level for determining a value of the input signal according to a difference between a first resistance corresponding to the termination resistance and a second resistance, thereby compensating for a difference between the actual value of the termination resistance and its nominal value.

25. An integrated circuit as recited in claim 24 wherein the second resistance is external to the integrated circuit.

* * * * *

UNITED STATES PATENT AND TRADEMARK OFFICE
CERTIFICATE OF CORRECTION

PATENT NO.         : 7,453,388 B1
APPLICATION NO. : 10/303398
DATED               : November 18, 2008
INVENTOR(S)       : Vadim Gutnik and Jerrell P. Hein It is certified that error appears in the above-identified patent and that said Letters Patent is hereby corrected as shown below:

Col. 8, line 46, please replace "radio" with --ratio--

Signed and Sealed this

Twentieth Day of January, 2009

JON W. DUDAS
*Director of the United States Patent and Trademark Office*